United States Patent [19]
Langley et al.

[11] Patent Number: 4,553,843
[45] Date of Patent: Nov. 19, 1985

[54] APPARATUS FOR DETERMINING THE ALIGNMENT OF LEADS ON A BODY

[75] Inventors: Dennis C. Langley, Palo Alto; Thomas T. Brekka, Soquel, both of Calif.

[73] Assignee: Micro Component Technology, Inc., St. Paul, Minn.

[21] Appl. No.: 592,759

[22] Filed: Mar. 26, 1984

Related U.S. Application Data

[63] Continuation of Ser. No. 289,921, Aug. 3, 1981, abandoned.

[51] Int. Cl.⁴ .................. G01B 11/04; G01B 11/14
[52] U.S. Cl. .................. 356/375; 250/223 R; 250/561; 356/385
[58] Field of Search ............... 356/372, 375, 385–387; 250/223 R, 560–561, 563

[56] References Cited

U.S. PATENT DOCUMENTS

| | | | |
|---|---|---|---|
| 2,185,010 | 12/1939 | Young | 250/223 R |
| 3,355,592 | 11/1967 | Muir | 250/224 |
| 3,856,412 | 12/1974 | Zanoni | 356/386 |
| 4,063,820 | 12/1977 | Borgese | 250/560 |
| 4,170,417 | 10/1979 | Tourres | 356/385 |
| 4,207,464 | 6/1980 | Fukuyama et al. | 250/239 |
| 4,264,202 | 4/1981 | Gugliotta | 250/561 |
| 4,346,294 | 8/1982 | Albaugh et al. | 250/239 |

FOREIGN PATENT DOCUMENTS 93002  7/1980  Japan .................. 356/387

OTHER PUBLICATIONS

Hojaboom et al, "Automatic Inspection System", IBM Tech. Disc. Bull., 4–1979, pp. 4426–4427.

Primary Examiner—William H. Punter
Attorney, Agent, or Firm—Lawrence M. Nawrocki

[57] ABSTRACT

Apparatus for determining the alignment of leads extending from a body of an integrated circuit package, including an optical system for producing data having information of the spacing between the leads and a data processor for determining the spacing between the leads in response to the data. A package handler sorts the package under control by the data processor.

24 Claims, 22 Drawing Figures

FIG_1

FIG_4

FIG_2

FIG_3

FIG_5

FIG_6

FIG_8

FIG_7

FIG_9

FIG_10

FIG_15

FIG_19

FIG_20

FIG_21

FIG _ 22

APPARATUS FOR DETERMINING THE ALIGNMENT OF LEADS ON A BODY

This application is a continuation of application Ser. No. 289,921, filed Aug. 3, 1981, and now abandoned.

BACKGROUND ART

This invention relates to apparatus for determining the alignment of leads on a body and, more particularly, to electro-optical apparatus for determining the spacing between the leads on the body.

Quality control of products is of prime importance to a manufacturer, as well as an end user of the products. Quality control procedures are implemented at intermediate stages in the manufacture or assembly of the products, and final quality control procedures are employed on the finished products. The variety of quality control techniques are as varied as the different products being produced.

One type of manufactured product may be generally described as a body having at least one lead extending from the body. One particular example of such a product, made by semiconductor companies, is known as an integrated circuit package. Typically each side of the package has a plurality of leads extending from the package body. The leads on each side of the finished package must be substantially in-line, i.e., aligned with one another. Otherwise, a defect such as misalignment of the leads can cause premature electrical or mechanical failure during the end use of the package.

Though stringent quality control techniques may be employed during assembly of the package, a significant number of finished packages have one or more bent leads which are not in-line. For example, one or more leads can be bent towards one another along a line parallel to a longitudinal axis of the package, or can be bent away from one another along a line perpendicular to the parallel line, or can have a combined bending having a component along the parallel line and a component along the perpendicular line. Consequently, all finished packages should be tested and those packages having bent leads should be rejected.

Furthermore, the bodies of many types of packages may include a base and a cover for the base, with the leads being supported between the cover and the base. Quality control is also concerned with producing finished packages having the cover substantially, if not precisely, aligned over the base, edge-for-edge. However, in a number of finished packages, the edges of the cover are significantly offset from the edges of the base, which also is disadvantageous. Therefore, packages having this offset should be rejected.

SUMMARY OF THE INVENTION

It is an object of the present invention to provide novel quality control apparatus.

Another object of the present invention is to provide apparatus for detecting defects in a manufactured product.

Still another object of the present invention is to provide quality control apparatus that accurately determines if products have defects and at maximum assembly line production rates.

The above and other objects of the present invention are carried out in one aspect of the invention which includes apparatus for determining the alignment of at least one lead extending from a body having an axis, the lead being subject to bending along a first line parallel to the axis, or being subject to bending along a second line perpendicular to the first line, or being subject to a combined bending having a component along the first line and a component along the second line, the apparatus comprising: first means for producing a first light beam being adapted to traverse a first path along the second line and to intersect the lead, first means for sensing the first light beam, second means for producing a second light beam being adapted to traverse a second path at an angle to the first line and the second line and to intersect the lead, and second means for sensing the second light beam.

In this one aspect of the invention, optical data acquired with the first light beam producing means and first sensing means have first information of the bending of the lead along the first line. Optical data acquired with the second light beam producing means and the second sensing means have second information of any combined bending of the lead along the first line and second line. The first information of the bending along the parallel line can be subtracted from the second information of the combined bending to also obtain information of the component of the bending along the second line.

In another aspect of the invention, apparatus is provided for determining the alignment of a plurality of leads on a body, the leads being spaced-apart from each other, comprising: optical means for producing data having information of the spacing between the leads, and data processor means for determining the spacing between the leads in response to the data. The results obtained with this other aspect of the invention will indicate if the spacing is such that the leads are bent or are in-line.

DETAILED DESCRIPTION OF THE INVENTION

Figure 1:
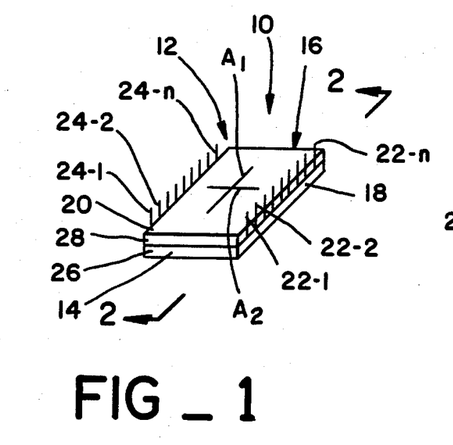
FIG. 1 is a view, in perspective, of a finished package.

FIG. 1 illustrates one example of a product 10 that can be in a given stage of production. The product 10 includes an object or body 12 which has a front end 14, a rear end 16, a left side 18 and a right side 20. A plurality of portions or leads 22, referenced respectively as 22-1, 22-2, ..., 22-n, extend from the body 12 on the left side 18. A plurality of portions or leads 24, referenced respectively as 24-1, 24-2, ..., 24-n, extend from the body 12 on the right side 20. The body 12 has a base 26 and a cover 28, with the leads 22 and leads 24 being supported between the base 26 and cover 28. Product 10 also can be considered to have an imaginary longitudinal axis $A_1$ and an imaginary orthogonal or right angle axis $A_2$ for coordinate reference purposes which will become apparent. As one example, product 10 can be a finished product known in the semiconductor industry as an n-lead, dual in-line, integrated circuit (IC) package.

Figure 2:
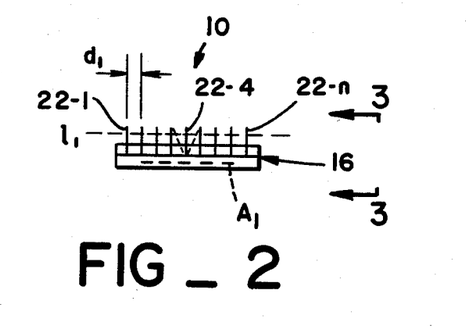
FIG. 2 is a side elevation taken along lines 2—2 of FIG. 1.

FIG. 2 illustrates in full lines a finished, quality product 10 whose leads 22-1 through 22-n and leads 24-1 through 24-n are in-line, i.e., the leads extend parallel to one another as seen from this side view. The product 10 may not exhibit satisfactory quality if one or more of the leads 22-1 through 22-n or leads 24-1 through 24-n are substantially bent from their parallel position along any imaginary line $1_1$, parallel to imaginary axis $A_1$. This is indicated for lead 22-4, which may be bent along line $1_1$, rearwardly, as shown by the dashed line, or frontwardly, as shown by the chain-dot line. This type of bending along parallel line $1_1$, is termed "parallel bending." Whereas all the leads 22-1, ... 22-n of an in-line product 10 are spaced-apart from one another a pre-designed distance $d_1$, this does not occur with a bent lead, such as bent lead 22-4, which is closer to or further away from adjacent leads than designed. If the distance $d_1$ between adjacent leads does not meet given tolerances, the package 10 should be rejected.

Figure 3:
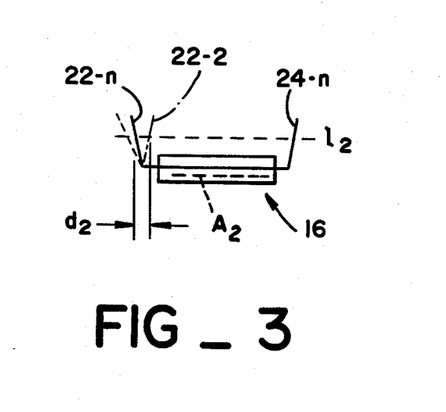
FIG. 3 is an end view taken along lines 3—3 of FIG. 2.

FIG. 3 illustrates in full lines the finished quality product 10 whose leads 22-1 through 22-n and leads 24-1 through 24-n are in-line, i.e., the leads are inclined and parallel to one another as seen from this end view. The product 10 may not exhibit satisfactory quality if one or more of the leads 22-1 through 22-n or leads 24-1 through 24-n are substantially bent from their inclined parallel position along any imaginary line $1_2$ perpendicular to line $1_1$ and parallel to imaginary axis $A_2$. This is indicated for lead 22-2 which may be bent along line $1_2$ outwardly, as shown by the dashed line, or inwardly, as shown by the chain-dot line. This type of bending along perpendicular line $1_2$ is termed "camber bending." A package 10 may not meet quality control specifications if a bent lead, such as lead 22-2, is bent a distance $d_2$ beyond given tolerances.

A third type of bending, called "combined bending", is discussed more fully below. A lead having "combined bending" has a component of "parallel bending" and a component of "camber bending".

Figure 4:
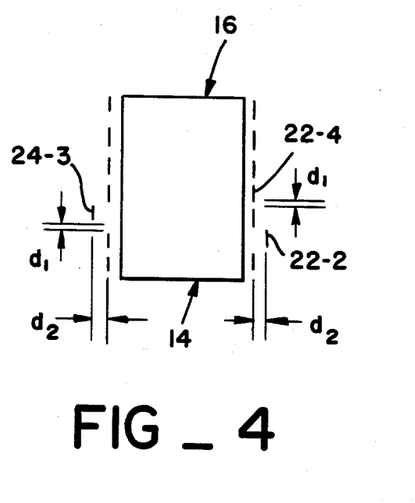
FIG. 4 is a top view of the finished package of FIG. 1.

FIG. 4 illustrates the three types of bending. The lead 22-4 is shown as having only "parallel bending" with distance $d_1$ being shorter than designed. The lead 22-2 is shown as having only "camber bending", with distance $d_2$ having a larger than designed value. A lead 24-3 is shown as having a "combined bending" since it has a component of "parallel bending" of distance $d_1$ and a component of "camber bending" of distance $d_2$.

Figure 5:
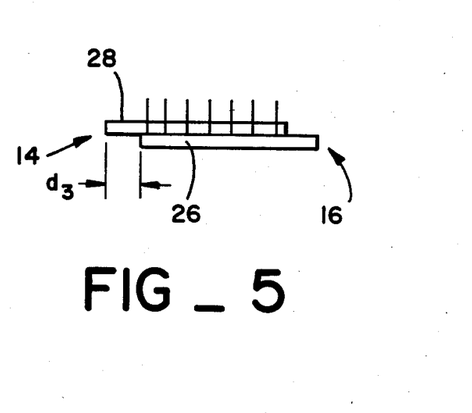
FIG. 5 is a view similar to FIG. 2 of another finished package.

FIG. 5 illustrates yet another defect that can accompany a finished product 10. A high-quality product 10 will have the cover 28 substantially, if not precisely, aligned, edge-for-edge, over the base 26. FIG. 5 shows a defective product 10 in which the cover 28 is offset from or overlaps the base 26 by a distance $d_3$.

Figure 6:
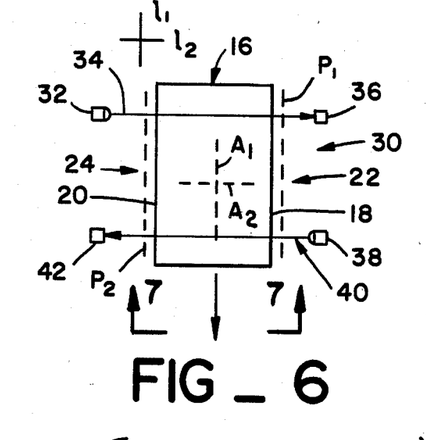
FIG. 6 is a schematic top view of a portion of an optical system of the present invention in conjunction with the package of FIG. 1.
Figure 7:
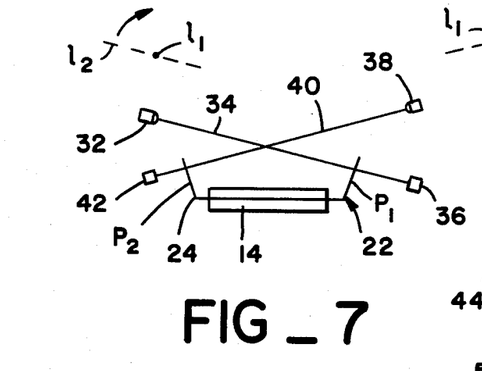
FIG. 7 is an end view taken along lines 7—7 of FIG. 6.

FIG. 6 and FIG. 7 illustrate an optical system 30 for producing data that has information for determining the alignment of one or more leads 22 or leads 24 and, in particular, to determine if there is "parallel bending". Relative movement between the optical system 30 and the product 10 is indicated by the arrow. The optical system 30 includes a light source 32 on the right side 20 of product 10 that produces a light beam traversing a path 34 which, as seen from FIG. 6, is along line $1_2$ and, hence, perpendicular to line $1_1$. A sensor 36, on the left side 18, senses the light beam from source 32 traversing path 34. As seen in FIG. 7, source 32 is elevated slightly relative to product 10 so that the light beam traversing path 34 is slightly inclined and intersects only the leads 22 and not leads 24. Note that the light beam traversing path 34 is still along line $1_2$ which also has been elevated slightly but is still perpendicular to line $1_1$. Consequently, as will be further described, sensor 36 will provide output data having information of the "parallel bending" of only the leads 22. As already indicated, one reason for slightly elevating source 32 is to avoid intersecting leads 24, which otherwise could obstruct the light path 34. If package 10 had no leads 24, source 32 need not be elevated, as viewed in FIG. 7; rather path 34, and the light beam traversing path 34, could be level. In either case, path 34 can be considered to extend along line $1_2$ perpendicular to line $1_1$.

If product 10 had only leads 22 and not leads 24, then optical system 30 need only include source 32 and sensor 36 to determine "parallel bending". Since product 10 also has leads 24, optical system 30 includes a light source 38 on the left side 18 that produces a light beam traversing a path 40 which, as seen in FIG. 6, is along line $1_2$ and, hence, perpendicular to line $1_1$. A sensor 42, on the right side 20, senses the light beam from source 38 traversing path 40. As seen in FIG. 7, source 38 is elevated relative to product 10 for similar reasons as source 32 so that the light beam traversing path 40 intersects only the leads 24 extending from the right side 20. Consequently, as will become apparent, sensor 42 will provide output data having information of the "parallel bending" of only the leads 24.

If the leads 22, 24 of product 10 were constrained to have only "parallel bending", then only the above described light sources 32, 38 and sensors 36, 42 are required for Quality Control. However, as already mentioned, the leads 22, 24 are subject to "camber bending" and "combined bending". Therefore, optical system 30 includes additional optical components for providing data having information of the "combined bending", from which can be derived information of the "camber bending".

Figure 8:
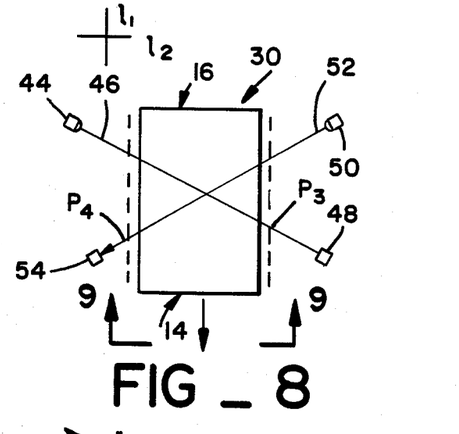
FIG. 8 is a schematic top view of another portion of the optical system of the present invention in conjunction with the package of FIG. 1.
Figure 9:
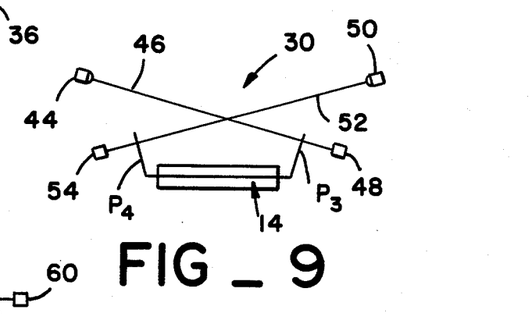
FIG. 9 is an end view taken along lines 9—9 of FIG. 8.

More particularly, as shown in FIG. 8 and FIG. 9, optical system 30, in addition to the optical components shown in FIG. 6 and FIG. 7, includes a light source 44 on the right side 20 of product 10 that produces a light beam traversing a path 46, and a sensor 48 on the left side 18 that senses the light traversing path 46. As may be appreciated from FIG. 8, the path 46 is at an angle to the line $1_1$, i.e., to the "parallel bending", and at an angle to the line $1_2$, i.e., to the "camber bending". As one example, each angle can be optimally 45°. As seen in FIG. 9, source 44 is slightly elevated relative to product 10 so that the light beam traversing path 46 intersects only the leads 22 extending from the left side 18. Consequently, as will be further described, sensor 48 will provide output data having information of the "combined bending" of only leads 22.

Since product 10 also has leads 24, optical system 30 includes a light source 50 on the left side 18 that produces a light beam traversing a path 52, and a sensor 54 on the right side 20 that senses the light traversing path 52. As seen in FIG. 8, the path 52 is at an angle to the line $1_1$, i.e., to the "parallel bending", and at an angle to the line $1_2$, i.e., to the "camber bending". As seen in FIG. 9, source 50 is slightly elevated relative to product 10 so that the light beam traversing path 52 intersects only the leads 24 extending from the right side 20. Source 44 and source 50 are slightly elevated for similar reasons described above.

Various embodiments of optical techniques may be employed in accordance with the principles of the present invention to acquire data for determining the alignment of the leads 22 or leads 24 and, in particular, for determining the interspatial distance between the leads. Optical system 30 is one embodiment and is based, in part, on the realization that only a small area or point of each lead need be examined optically to acquire sufficient data for these purposes. This is illustrated in FIG. 6 through FIG. 9 which show that the light paths 34, 40, 46, 52 intersect the leads 22, 24 at respective small points $P_1$, $P_2$, $P_3$, $P_4$ on the leads 22, 24. The points $P_1$-$P_4$ preferably are approximately one eighth to one quarter of the distance down from the top of aligned leads 22, 24. Since only such points $P_1$-$P_4$ are examined, each light source 32, 38, 44, 50 can be, for example, a point light source emitting, for example, infrared light, and each sensor 36, 42, 48, 54 can be a single photodetector such as a phototransistor detecting the infrared light.

In another embodiment of an optical system (not shown), each point light source 32, 38, 44, 50 can be replaced by, for example, a light source whose light is controlled to intersect the entire leads 22, 24, and each single photodetector 36, 42, 48, 54 can be replaced by a linear photodiode array. Such a light source can be a laser. As the product 10 moves relative to this other optical system, the linear photodiode array will output data corresponding to each entire lead.

Another embodiment of an optical system may include a light source that illuminates an entire line of leads such as leads 22, with the product 10 being stationary. A sensor for this system may be a TV camera that electronically scans this "picture" of all the leads.

Note that in all of the above-mentioned optical systems, optical data will be acquired of at least points $P_1$-$P_4$ on each lead. One advantage of acquiring optical data only of points $P_1$-$P_4$ for each lead is that the amount of data that is processed electronically, as will be discussed, is minimized. Furthermore, infrared point sources and single phototransistors are less costly than lasers, linear photodiode arrays and TV cameras.

Figure 10:
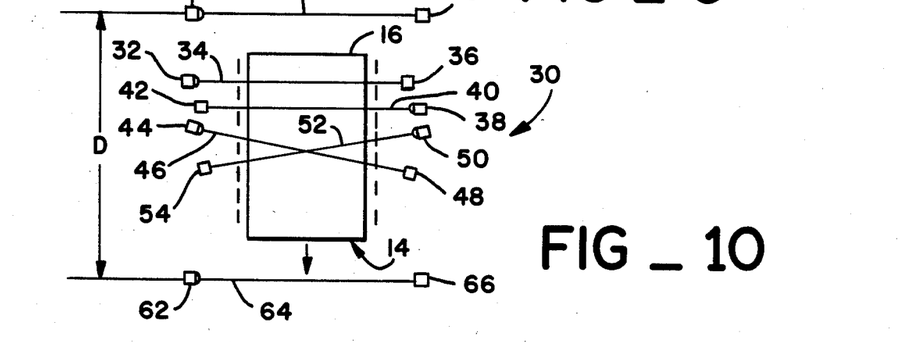
FIG. 10 is a top view of an overall optical system of the present invention in conjunction with the package of FIG. 1.

FIG. 10 illustrates one example of the combined positioning of the various optical components of optical system 30 thus far described. In addition, for lead-alignment determining purposes, optical system 30 includes a light source 56 that produces a light beam traversing a path 58 extending across and intersecting body 12. A sensor 60 senses the light beam traversing path 58. Another light source 62 produces a light beam traversing a path 64 extending across and intersecting body 12. A sensor 66 senses the light beam traversing path 64.

As viewed in FIG. 10, path 58 is anterior of the paths 34, 40, 46, 52 in the direction of travel of product 10, whereas path 64 is posterior of the paths 34, 40, 46, 52. Light source 56 and light source 62 are spaced-apart a predetermined distance D, e.g., 2", and sensors 60, 66 detect when front end 14 intersects paths 58, 64, respectively. As will be further described, the output data of sensors 60, 66 are used to determine the spacing of each lead 22, 24 relative to a reference point which is the front end 14 by considering the average velocity of product 10.

Figure 11:
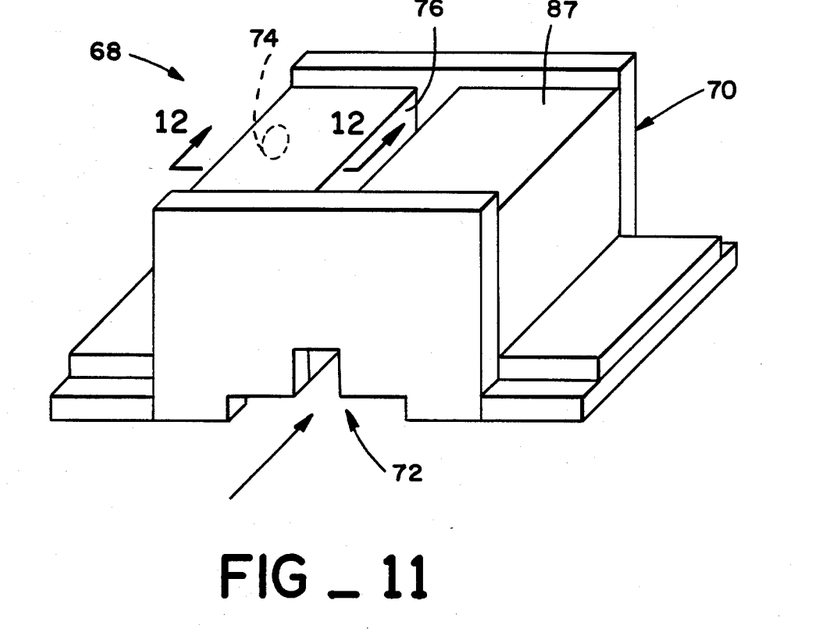
FIG. 11 is a view in perspective of a self-contained module of the present invention.
Figure 12:
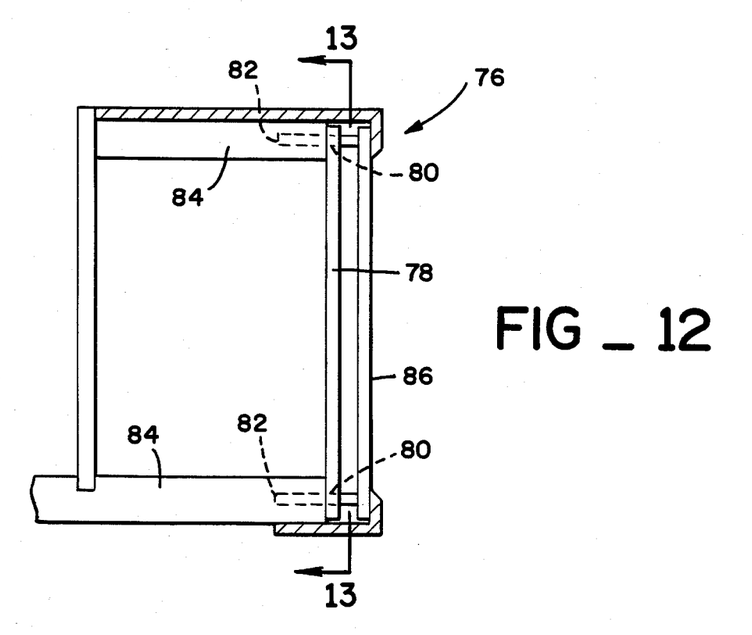
FIG. 12 is a cross section taken along lines 12—12 of FIG. 11.

A self-contained module 68 for the optical system 30 is shown in FIG. 11. The module 68 has a housing 70 that provides a channel 72 through which the product 10 is movable in the direction indicated by the arrow, and has a cable connector 74. With reference to FIG. 11 and FIG. 12, one side 76 of housing 70 to the left of channel 72 includes a printed circuit board 78 having apertures 80 that are on locating pins 82 extending through upper and lower brackets 84. A glass plate 86 extends over the printed circuit board 78. The side 87 of housing 70 to the right of channel 72 has similar components (not shown).

Figure 13:
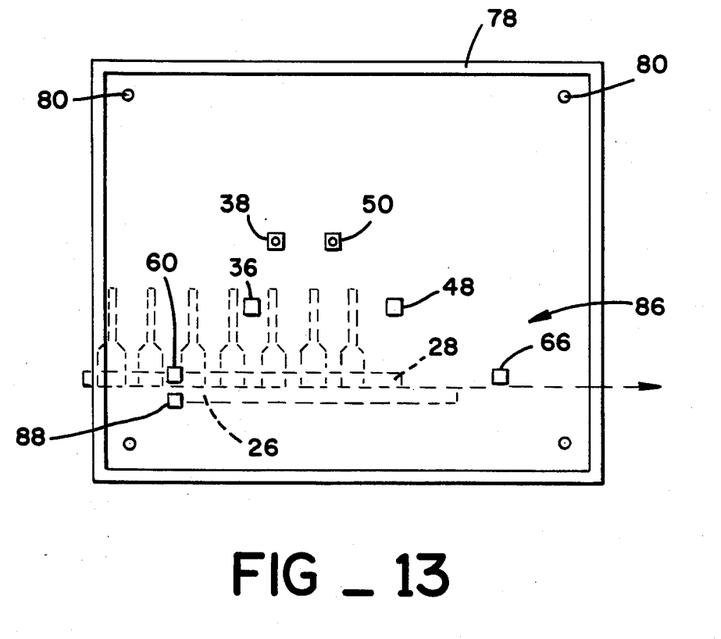
FIG. 13 is a cross section taken along lines 13—13 of FIG. 12.

FIG. 13 illustrates a portion of optical system 30 which is embodied on the printed circuit board 78. Also shown in phantom lines is the product 10 as it moves along channel 72 in the direction indicated by the arrow. Printed circuit board 78 has, in series, sensor 60, sensor 36, light source 38, light source 50, sensor 48 and sensor 66 that are also shown in FIG. 10. The printed circuit board (not shown) on the right side of channel 72 has, in series, the light source 56, light source 32, sensor 42, light source 44, sensor 54 and light source 62 shown in FIG. 10.

Yet another sensor 88 is shown in FIG. 13 and is positioned beneath sensor 60. The combination of sensor 60, which is in-line with cover 28, and sensor 88, which is in-line with base 26, is used to provide data for detecting the offset problem illustrated in FIG. 5 and indicated in FIG. 13. Another light source (not shown) and light path (not shown) are directly under light source 56 and path 58 (see FIG. 10). Because, as shown in FIG. 13, the cover 28 is offset from the base 26, the former will intersect light path 58 (see FIG. 10) at a different time than the latter will intersect the light path (not shown) under path 58 as product 10 moves through module 68. Consequently, the output data from one sensor 60, 88 will be delayed relative to the output data of the other sensor 60, 88 and this indicates the offset.

The space or distance betweeen side 76 and side 87 at which the printed circuit boards are held will be different from one module 68 to another module 68. This spacing will be dependent on the width of a given package 10. The reason for this, as can be seen, is to ensure that the various light paths cross the same points $P_1$-$P_4$ on the leads for any width package. A wider package requires a wider spacing. By changing this spacing of the modules, the same printed circuit boards can be used for all modules.

Figure 14:
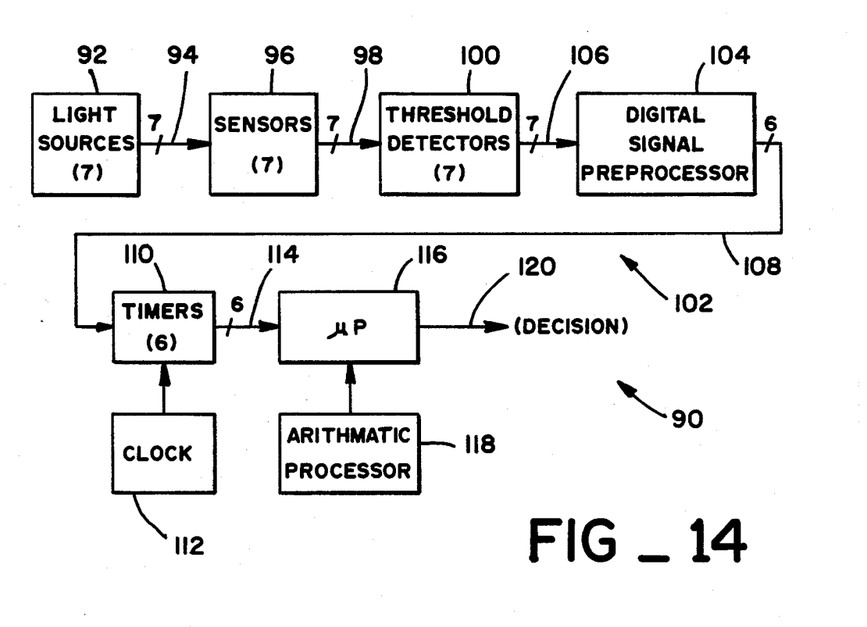
FIG. 14 is a block diagram of an electro-optical system of the present invention.

FIG. 14 shows an electro-optical system 90 for determining the interspatial distance of leads 22 and of leads 24 of a product 10, and, hence, the alignment of these leads. While electro-optical system 90 will be described using the optical system 30, it will become appreciated that the other optical systems mentioned above can be used to acquire data on which to determine this interspatial distance.

As indicated in block diagrams, electro-optical system 90 includes seven light sources 92, corresponding respectively to light sources 32, 38, 44, 50, 56, 62, and the source (not shown) beneath source 56, seven light paths 94 corresponding, respectively, to paths 34, 40, 46, 52, 58, 64, and the path (not shown) beneath path 58 and seven sensors 96 corresponding respectively to sensors 36, 42, 48, 54, 60, 66, 88. The output data of sensors 96 are produced as pulse waveforms on seven respective output lines 98 and each pulse waveform is threshold detected by respective threshold detectors 100. If it is assumed that the pulses of each waveform on lines 98 exceed the threshold set in threshold detectors 100, then the latter produces seven rectangular wave pulse waveforms shown in FIG. 15.

Figure 15:
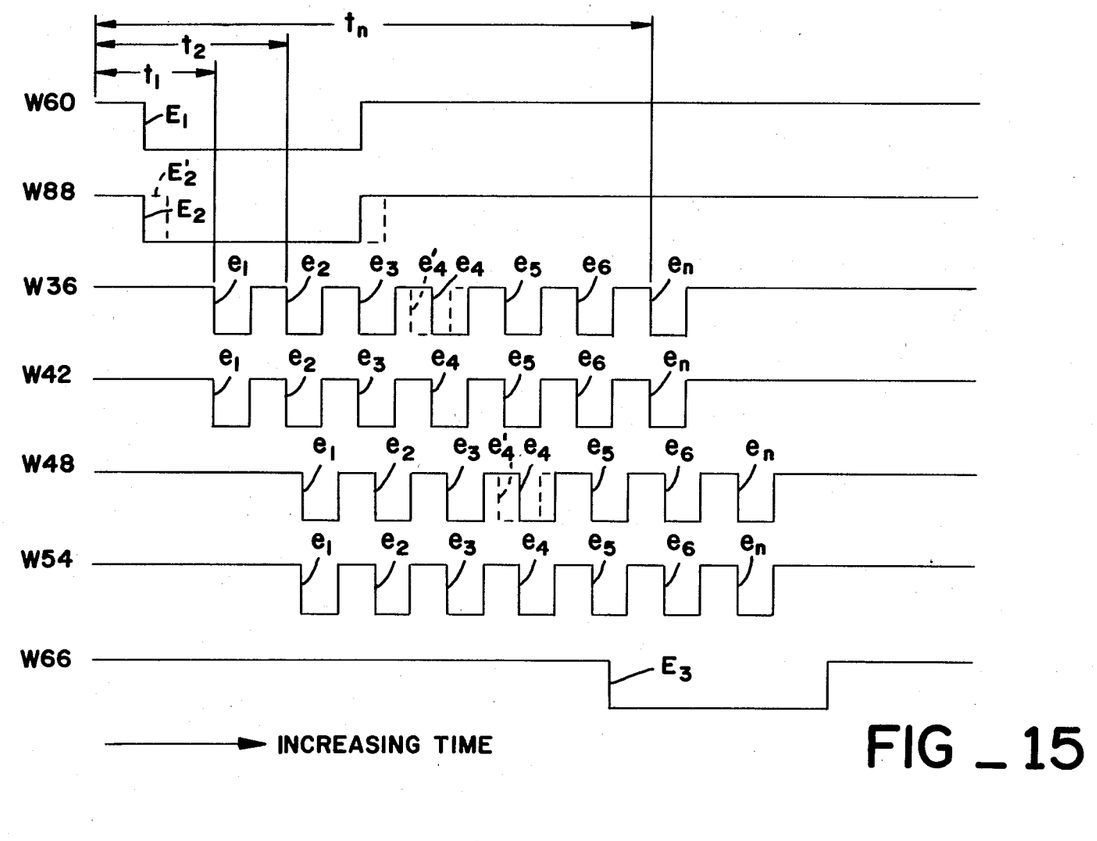
FIG. 15 illustrates seven pulse waveforms used to explain the present invention.

A pulse waveform $W_{60}$ shown in FIG. 15 corresponds to the output data from sensor 60. A pulse waveform $W_{88}$ corresponds to the output data of sensor 88. A pulse waveform $W_{36}$ corresponds to the output data from sensor 36. A pulse waveform $W_{42}$ corresponds to the output data from sensor 42. A pulse waveform $W_{48}$ corresponds to the output data from sensor 48. A pulse waveform $W_{54}$ corresponds to the output data from sensor 54. A pulse waveform $W_{66}$ corresponds to the output data from sensor 66. All the pulse waveforms shown in FIG. 15 in full line represent a product 10 whose leads 22 and leads 24 are in-line, and whose cover 28 and base 26 are precisely aligned. The dotted lines are used to explain bending of the leads 22, 24 and an offset between the cover 28 and base 26.

A leading edge $E_1$ of waveform $W_{60}$ is produced when the cover 28 at front end 14 traverses path 58. A leading edge $E_2$ of waveform $W_{88}$ is produced when the base 26 at front end 14 traverses the path beneath path 58. The dotted line of waveform $W_{88}$ showing a leading edge $E_2'$ relative to edge $E_1$ is information that cover 28 is offset relative to base 26. The full lines showing the aligned position of edge $E_1$ and edge $E_2$ is information that cover 28 and base 26 are not offset.

A leading edge $E_3$ of waveform $W_{66}$ is produced when front end 14 traverses path 64. As will be more fully described, the time between the occurrence of edge $E_1$ and edge $E_3$ is used to determine the velocity or speed of product 10 through optical system 30. It will be assumed until otherwise indicated that the product 10 is moving at a constant velocity. Also, the edge $E_1$, since it corresponds to front end 14, is used as a reference from which to determine the interspatial distance between leads 22 or leads 24.

Waveform $W_{36}$ shows a plurality of leading edges $e_1$-$e_n$ corresponding, respectively, to leads 22-1 to 22-n. Each edge $e_1$-$e_n$ of waveform $W_{36}$ is produced when respective leads 22-1 to 22-n traverse path 34. The edges $e_1$-$e_n$ are equally spaced from one another, providing information that there is no "parallel bending" of any one or more of the leads 22. As shown in dotted line, an edge $e_4'$ corresponding to lead 22-4 is closer to edge $e_3$, which provides information that there is "parallel bending" of lead 22-4 frontwardly.

Waveform $W_{42}$ shows a plurality of leading edges $e_1$-$e_n$ corresponding, respectively, to leads 24-1 to 24-n. Each edge $e_1$-$e_n$ of waveform $W_{42}$ is produced when respective leads 24-1 to 24-n traverse path 40. The edges $e_1$-$e_n$ of waveform $W_{42}$ are equally spaced from one another, providing information that there is no "parallel bending" of any one or more of the leads 24.

Waveform $W_{48}$ shows a plurality of leading edges $e_1$-$e_n$ corresponding, respectively, to leads 22-1 to 22-n. Each edge $e_1$-$e_n$ of waveform $W_{48}$ is produced when respective leads 22-1 to 22-n traverse path 46. These edges $e_1$-$e_n$ are equally spaced from one another, providing information that there is no "combined bending". The dotted line showing edge $e_4'$ of waveform $W_{48}$ provides information that there may be "combined bending" for lead 22-4 since it is closer to edge $e_3$.

Since path 46 is at an angle as previously described, this "combined bending" information alone does not indicate the amount or component of "parallel bending" and the amount or component of "camber bending". However, from waveform $W_{36}$, the distance between edge $e_4'$ and edge $e_3$ gives information of the component of "parallel bending". Then, by subtracting this "parallel bending" component from the distance between edge $e_4'$ and edge $e_3$ of waveform $W_{48}$, the component of "camber bending" is identified. If the subtraction results in 0, then there is only "parallel bending". If the subtraction results in a number greater than 0, then there is a component of "camber bending" corresponding to this number. If, as another example, waveform $W_{36}$ shows no "parallel bending" for lead 22-4 corresponding to the full line edge $e_4$, but dotted line $e_4'$ of waveform $W_{48}$ shows "combined bending", then the subtraction indicates only "camber bending".

Waveform $W_{54}$ shows a plurality of leading edges $e_1$-$e_2$ corresponding, respectively, to leads 24-1 to 24-n. Each edge $e_1$-$e_n$ of waveform $W_{54}$ is produced when respective leads 24-1 to 24-n traverse path 52. The edges $e_1$-$e_n$ of waveform $W_{54}$ are equally spaced, providing information that there is no "combined bending" for leads 24.

Electro-optical system 90 includes a data processor shown generally at 102. A digital signal pre-processor 104 receives the seven pulse waveforms $W_{60}$, $W_{88}$, $W_{36}$, $W_{42}$, $W_{48}$, $W_{54}$ and $W_{66}$ over seven lines 106 and combines them to extract five output pulse waveforms $W_1$-$W_5$, shown in FIG. 16, on five lines 108.

Figure 16:
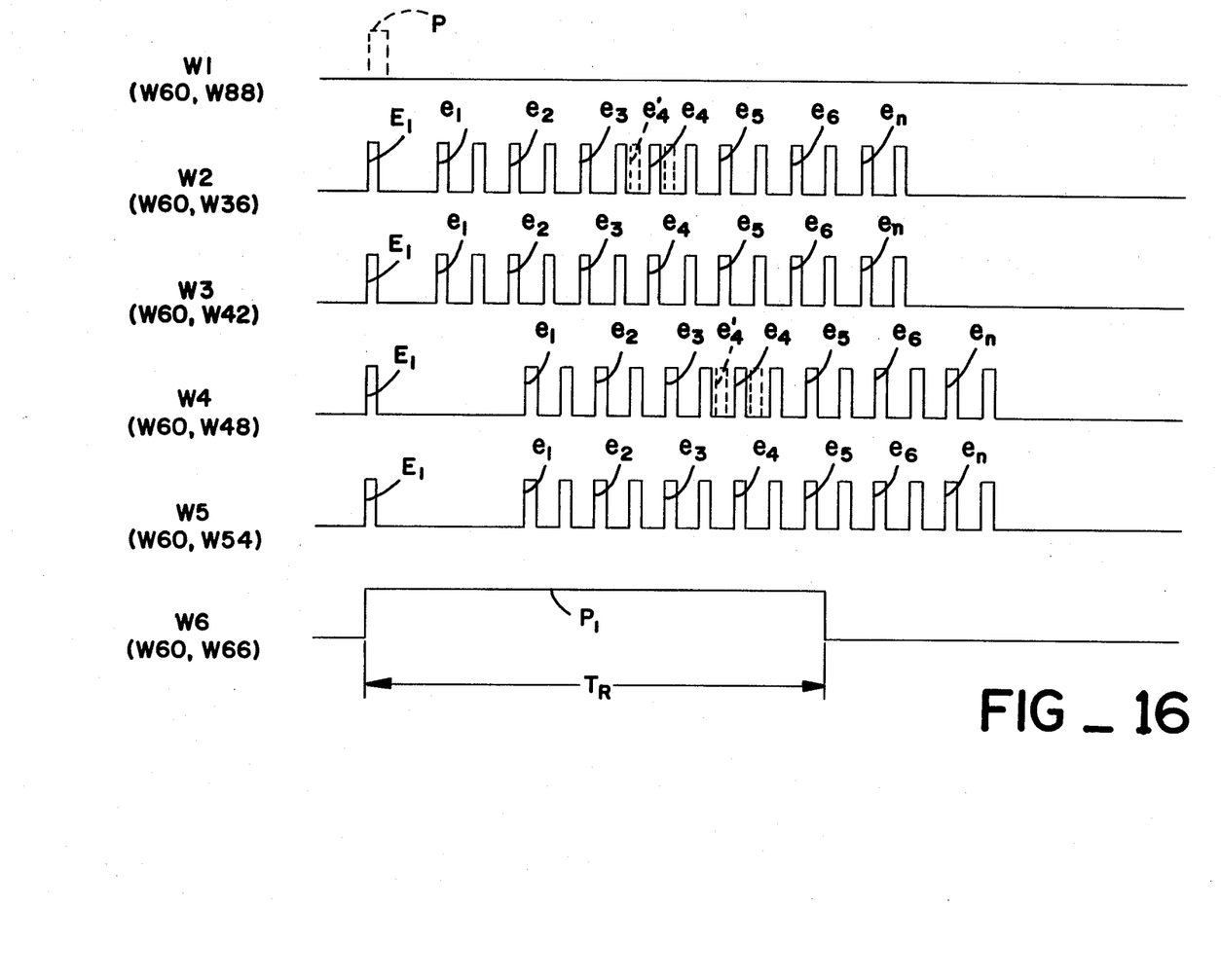
FIG. 16 illustrates six pulse waveforms used to explain the present invention.

Waveform $W_1$ is a combination of waveform $W_{60}$ and waveform $W_{88}$. If waveform $W_1$ has no pulses, as shown in full line, this indicates that edge $E_1$ of waveform $W_{60}$ and edge $E_2$ of waveform $W_{88}$ coincide and, therefore, that cover 28 and base 26 are precisely aligned. Otherwise, a pulse P shown in dotted line is produced to indicate the offset between cover 28 and base 26, with one edge corresponding, for example, to edge $E$, and the other edge to edge $E_2'$.

Waveform $W_2$ is a combination of waveforms $W_{60}$, $W_{36}$, but inverted. Like reference numerals in waveform $W_2$ are used to indicate like leading edges in waveforms $W_{60}$, $W_{36}$. Similar referencing is employed for the other waveforms $W_3$, $W_4$, $W_5$, $W_6$. Waveform $W_3$ is a combination of waveforms, $W_{60}$, $W_{42}$, waveform $W_4$ is a combination of waveforms $W_{60}$, $W_{48}$, waveforms $W_5$ is a combination of waveform $W_{60}$, $W_{54}$, and waveform $W_6$ is a combination of waveforms $W_{60}$, $W_{66}$. These six waveforms $W_1$-$W_6$ are produced by performing logical operations with various logic gates (not shown) in digital signal pre-processor 104.

Data processor 102 has six retriggerable timers 110 each receiving one of the waveforms $W_1$-$W_6$. The timers 110 are clocked by a common clock 112. As one example, and with respect to waveform $W_2$, the occurrence of edge $E_1$ commences the counting of clock pulses from clock 112 by one of the timers 110 from a count of 0. Then, as each edge $e_1$-$e_n$ occurs, the one timer 110 outputs a 16-bit number corresponding to a cumulative time of occurrence of an edge $e_1$-$e_n$ relative to edge $E_1$. Then, assuming the velocity of product 10 is known, as will be further discussed, this timing information provided by each 16-bit number is converted to data indicating the distance between an edge $e_1$-$e_n$ and edge $E_1$ or, in other words, the distance between a corresponding lead 22 and the reference front end 14. The difference between these 16-bit numbers is the interspatial distance betwee leads 22. Similar 16-bit numbers are produced by the other timers 110 in response to waveforms $W_3$-$W_6$. For waveform $W_1$, if no pulse occurs, as shown in full lines, a 16-bit number equal to 0 is produced by one of the timers 110 to indicate no offset between cover 28 and base 26, whereas a pulse P in waveform $W_1$ will produce a 16-bit number corresponding to the width of pulse P informing of an offset. The 16-bit numbers are outputted by the timers 110 on six respective lines 114.

A microprocessor 116 and an arithmetic processor 118, under software control to be further described, processes the 16-bit data being received on lines 114. Calculations are made from this data of the interspatial distance between leads 22 and leads 24. If these calculations show that one or more of the leads has been subjected to "parallel bending" or "camber bending" beyond predetermined tolerances, data for which are stored in memory, a decision is made to reject the product 10 and a control signal is produced on an output line 120 so indicating. Otherwise, a decision is reached that the product 10 has all leads which are in-line and another control signal is produced on line 120 so indicating. Similar decisions can be made in response to the waveform $W_1$ in determining if product 10 should be rejected due to an offset beyond acceptable tolerances.

Figures 17, 18:
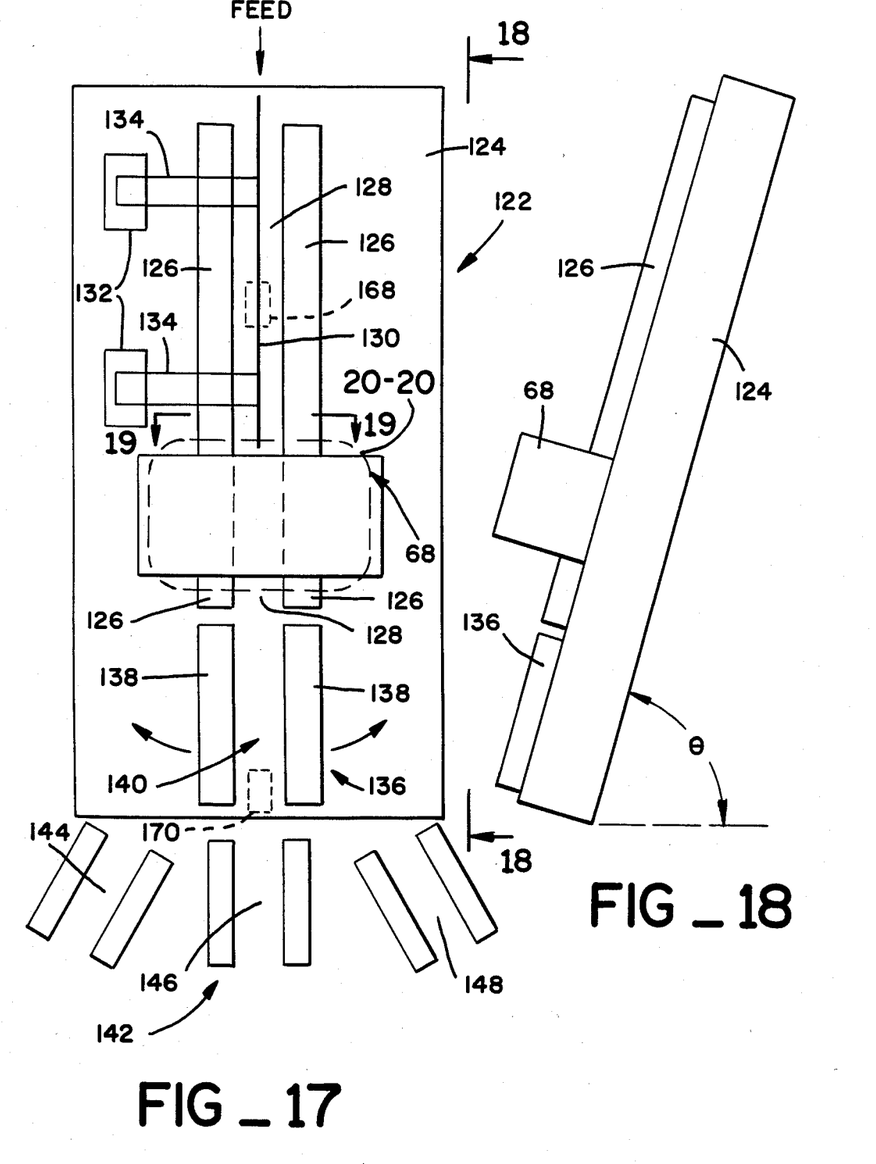
FIG. 17 is a top view of a package handler of the present invention.
FIG. 18 is an end view taken along lines 18—18 of FIG. 17.

FIG. 17 illustrates an automatic package handler 122 which may be used with self-contained module 68. Package handler 122 may be any one of several models manufactured by Trigon Industries, Inc., Mountain View, Calif., such as Models T-2010 through 2080 but slightly modified to accommodate module 68. Package handler 122 has a processing trough 124, rails 126 defining a channel 128, and a pivotally mounted center retainer 130 that is pivotally mounted on brackets 132 via arms 134.

The module 68 is supported on the trough 124 so that channel 72 is aligned with channel 128. A sort mechanism 136, having rails 138 and a channel 140, is pivotally mounted on trough 124. A universal output device 142 has three fixed channels 144, 146, 148 which will be aligned with channel 140 depending on the pivotal position of sort mechanism 136.

Package handler 122 is a gravity-fed device and is at an angle $\theta$ to the horizontal, as indicated in FIG. 18. A package 10, after being fed into channel 128 with its leads 22, 24 extending upwardly and center retainer 130 over cover 28, falls by gravity through module 68 and into channel 140 of sort mechanism 136. Then, depending on the decision made by opto-electronic system 90, sort mechanism 136 is pivoted to output the package 10 in one of channels 144, 146, 148. Package handler 122 has a system (not shown) called a "singulator", which will allow a plurality of packages 10 to be fed into or held in the upper portion of channel 128, but process only one package 10 at time through module 68. This processing will be described in more detail in connection with FIG. 22.

Figure 19:
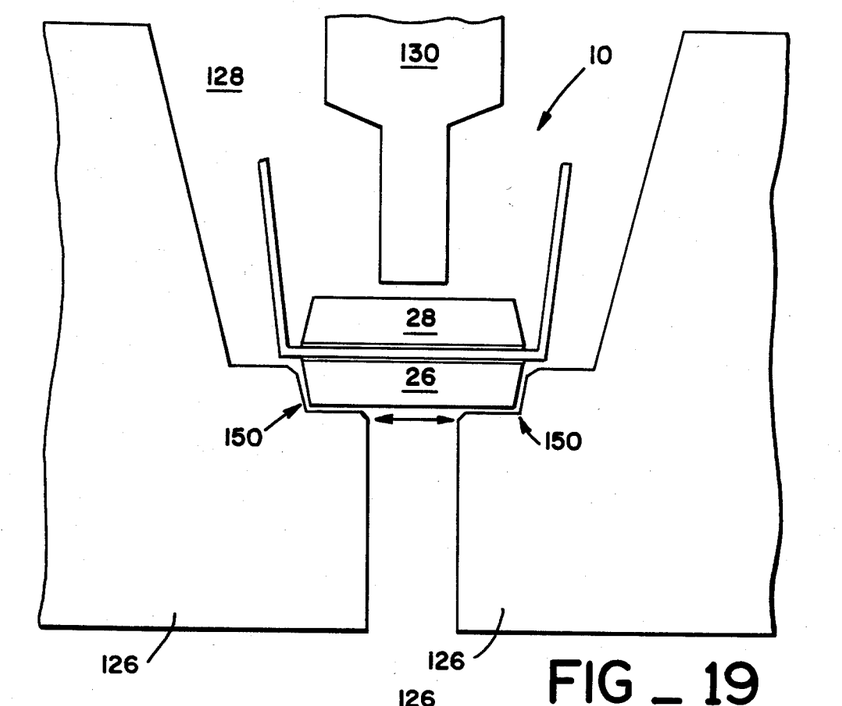
FIG. 19 is a cross section taken along lines 19—19 of FIG. 17.
Figure 20:
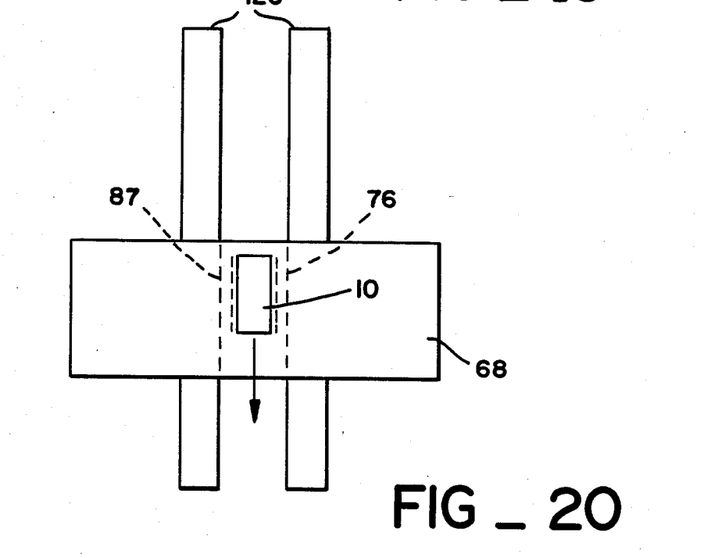
FIG. 20 is an exploded view of the package handler taken around lines 20—20 of FIG. 17.

FIG. 19 illustrates a package 10 being in the channel 128. Rails 126 are shaped at 150 to follow the contour of any particular base 26. This shape inhibits oscillating motion of the package 10 in the direction of the double headed arrow as it is fed through module 68 to reduce noise in the optical data. FIG. 20 shows in more detail the relationship of module 68 to rails 126.

With respect to the manner of calculating the interspatial distances between the leads 22 or leads 24, the timing data from timers 110 and shown in FIG. 16 are gathered by microprocessor 116. Then, for reasons which will be discussed, the timing data is linearized for the effect of acceleration under free-fall of product 10 through optical system 30, and then converted into distances according to the following formula:

$$X_n = T_{SUM}[V_R - A(T_R - T_{SUM})] \tag{1}$$

where $$V_R = X_R/T_R; \quad A = g(\sin\theta)/2; \quad T_{SUM} = t_1 + t_2 + \ldots + t_n$$

$\theta$ = the incline shown in FIG. 18 from the horizontal of the fall direction of product 10 g = the gravitational constant $X_R$ = the predetermined reference distance D between path 58 and path 64 shown in FIG. 10

$T_R$ = the time represented by pulse $P_1$ of waveform $W_6$ for product 10, e.g. front end 14, to fall through $X_R$ $V_R$ = average velocity of product 10

$t_n$ = the incremenetal time indicated in FIG. 16

$X_n$ = the distance of each lead from the front end 14 determined from the elapsed time $t_n$.

Figure 21:
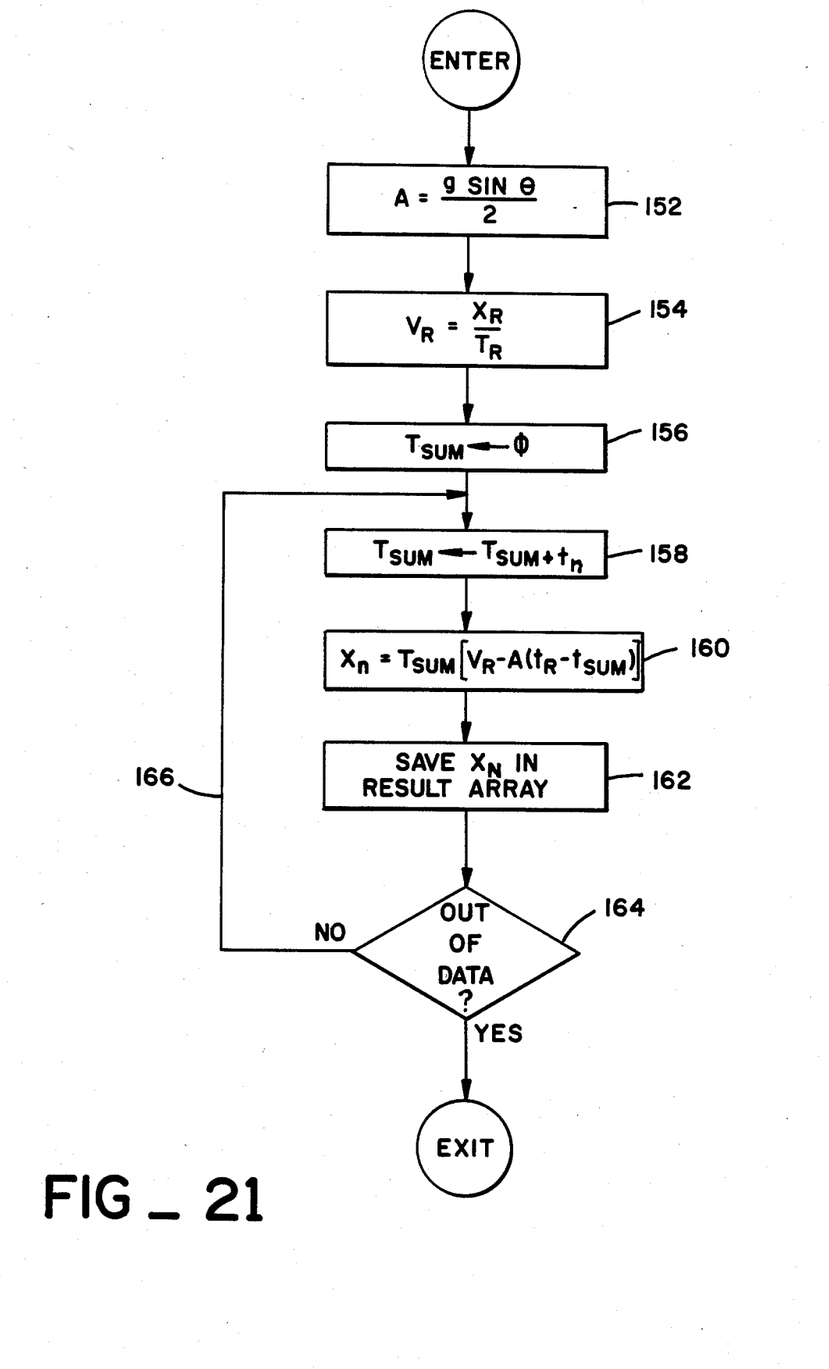
FIG. 21 is a flow chart used to explain an algorithm of the present invention.

For the general case of free-fall under gravitational force, equation 1 is solved for each time event shown by the waveforms in FIG. 16 in accordance with the following procedure shown in FIG. 21. First, the constant A is computed (block 152), then the average velocity $V_R$ is calculated (block 154), and then a register holding $T_{SUM}$ is set equal to 0 (block 156).

Next, the time $t_n$ is added to $T_{SUM}$ (block 158) and then $X_n$ is calculated (block 160). Then $X_n$ is stored or saved in a result array for later use (block 162). If there is no more data (block 164), i.e., if all the leads have passed through optical system 30, then the program exits; otherwise, a loop is made via line 166 to calculate and store $X_n$ for another lead.

Having calculated and stored $X_n$ for each lead, microprocessor 116 has sufficient data now to go through another simple routine under software control to determine the interspatial distance between the leads to make a decision whether there is "parallel bending" and/or "camber bending." Thus, for example, to determine if there is any "parallel bending" of leads 22 beyond given tolerances, $X_n$ for one lead 22 can be subtracted from $X_n$ for an adjacent lead 22, where these $X_n$'s are calculated from waveform $W_2$. The difference then can be compared to the predetermined stored tolerance data, as mentioned previously.

As shown in FIGS. 17-20, the product 10 is gravity-fed through optical system 30 and, in particular, module 68. Consequently, because of the effects of gravity, the product 10 is constantly accelerating so that the leads nearer the rearward end 16 will move faster through module 68 than the leads nearer the front end 14. Of course, though, the interspactial distance of the leads will remain the same. Consequently, the software preferably should linearize the data to account for this acceleration.

Furthermore, the principles of the present invention apply if angle $\phi$ is 0 such that, for example, product 10 is being moved through a module 68 on a conveyor belt (not shown) at a known constant velocity, rather then via package handler 122. In this event, A=0 and equation 1 is simplified, and data of the known constant velocity can be prestored in memory.

Also, while digital signal pre-processor 104 and waveforms $W_1$-$W_5$ of FIG. 16 have been shown and described, as well as the algorithm of FIG. 21, it will be appreciated that the waveforms shown in FIG. 15 contain all the data needed to determine the interspatial distances of the leads 22, 24. Thus, other pre-processors and other algorithms may be used to determine these distances.

With reference again to FIGS. 17-20 and to FIG. 22, and in particular to the "singulator" of the package handler 122 previously mentioned, a procedure will be described that allows a substantial number of products 10 to be processed and sorted, for example, as many as about 10,000/hour. As one example, center channel 146 of universal output device 142 can receive good products 10, side channel 148 can receive bad, but repairable products 10, and side channel 144 can receive bad unrepairable products 10.

Generally, a plurality of products are fed onto channel 128 and held by a solenoid-operated stop of the "singulator" near the top portion of channel 128 as indicated by a reference numeral 168 in FIG. 17. Another solenoid-operated stop is at a lower position as indicated by a reference numeral 170 in FIG. 17. Just prior to releasing the next product 10 from stop 168, the last product 10 that was gravity fed through module 68 is stopped at stop 170. If this last product 10 was good, then sort mechanism 136 may remain in the position shown in FIG. 17 to direct this product into channel 146. This last product, therefore, may be released from stop 170 into channel 146 at the same time the next product 10 being held at stop 168 is released for processing through module 68 since no time is required for moving the sort mechanism from the center position. If the last product was not good, time should be allowed before the next product is released by stop 168 to move the sort mechanism 136 either to the left or right to sort the last product and then to return to the center position in anticipation of receiving the next product.

Figure 22:
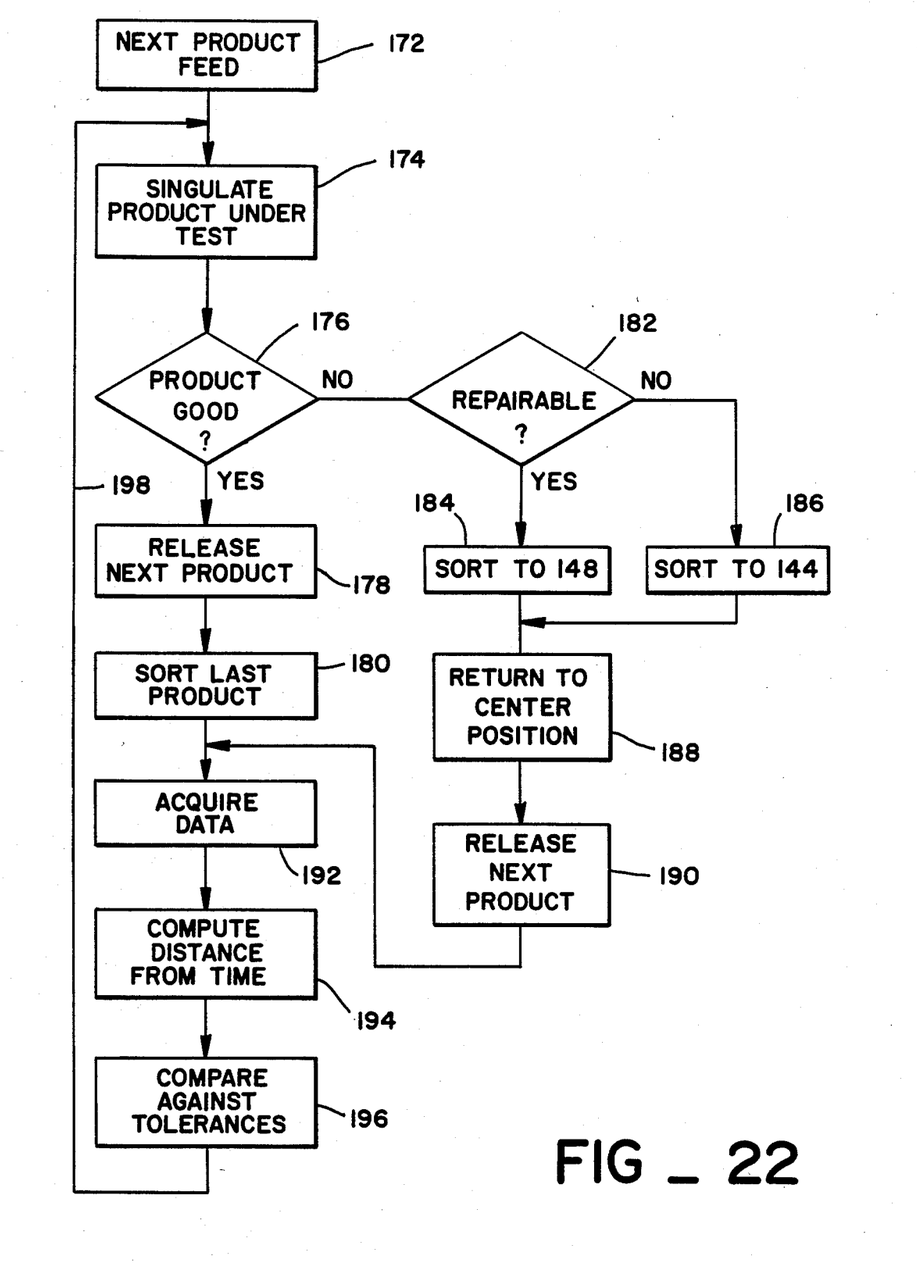
FIG. 22 is another flow chart used to explain another algorithm of the present invention.

The above procedure is illustrated in more detail in FIG. 22. Assume that a number or line of products 10 have been fed onto channel 128 with the next product in line being at stop 168 (block 172) and the last product already processed by module 68. This next product is now ready to be "singulated" (block 174). If the last product presently at stop 170 was good (block 176), the next product at stop 168 is released (block 178) and the last product is sorted (block 180). If the last product was not good (block 176) and if the last product is or is not repairable (block 182), sort mechanism 136 is moved to the right to channel 148 (block 184) or to the left to channel 144 (block 186), and then returned to the center position (block 188). Then, the next product at stop 168 is released (block 190) to module 68 so that data is acquired (block 192), lead interspatial distances are calculated (block 194), and a comparison made between those distances and the stored tolerance data (block 196). The program then loops via line 198 to "singulate" another product at stop 168 (block 174).

Other aspects, objects and advantages of this invention can be obtained from a study of the drawings, the disclosure and the appended claims.

We claim:

1. Apparatus for determining the alignment of at least one lead extending from a body having an axis, the lead being subject to bending along a first line parallel to the axis or being subject to bending along a second line perpendicular to the first line or being subject to a combined bending having a component along the first line and a component along the second line, comprising:
   (a) first means for producing a first light beam being adapted to traverse a first path along the second line and to intersect the lead;
   (b) first means for sensing the first light beam;
   (c) second means for producing a second light beam being adapted to traverse a second path at an angle to the first line and the second line and to intersect the lead; and
   (d) second means for sensing the second light beam.

2. Apparatus according to claim 1 wherein said first means for producing comprises a first source of light.

3. Apparatus according to claim 2 wherein said second means for producing comprises a second source of light.

4. Apparatus according to claim 3 wherein said first means for sensing and said second means for sensing each comprises a photodetector.

5. Apparatus according to claim 1 wherein the angle is optimally 45° to the first line and the second line.

6. Apparatus for determining the alignment of any one or more of a plurality of first leads and second leads extending from a body having an axis, a first side at which the first leads are located and a second side at which the second leads are located, any one or more of the first leads and second leads being subject to bending along a first line parallel to the axis or being subject to bending along a second line perpendicular to the first line or being subject to a combined bending having a component along the first line and a component along the second line, comprising:
   (a) first means for producing a first light beam being adapted to traverse a first path along the second line and to intersect only the first leads;
   (b) first means for sensing the first light beam;
   (c) second means for producing a second light beam being adapted to traverse a second path along the second line and to intersect only the second leads;
   (d) second means for sensing the second light beam;

(e) third means for producing a third light beam being adapted to traverse a third path at an angle to the first line and the second line and to intersect only the first leads;
(f) third means for sensing the third light beam;
(g) fourth means for producing a fourth light beam being adapted to traverse a fourth path at an angle to the first line and the second line and to intersect only the second leads; and
(h) fourth means for sensing the fourth light beam.

7. Apparatus according to claim 6 wherein the body has a front end, and further comprising:
(a) fifth means for producing a fifth light beam being adapted to traverse a fifth path extending across and intersecting the front end, the fifth path being anterior of the first through fourth paths;
(b) fifth means for sensing the fifth light beam;
(c) sixth means for producing a sixth light beam being adapted to traverse a sixth path extending across and intersecting the front end, the sixth path being posterior of the first through fourth paths and at a predetermined distance from the fifth path; and
(d) sixth means for sensing the sixth light beam.

8. Apparatus according to claim 6 wherein the body has a cover and a base, the first leads and the second leads being supported on the base between the cover and base, and wherein the cover and base are subject to relative misalignment, further comprising:
(a) fifth means for producing a fifth light beam being adapted to traverse a fifth path extending across and intersecting the cover;
(b) fifth means for sensing the the fifth light beam;
(c) sixth means for producing a sixth light beam being adapted to traverse a sixth path extending across and intersecting the base; and
(d) sixth means for sensing the sixth light beam.

9. A self-contained module for determining the alignment of any one or more of a plurality of first leads and second leads extending from a body having an axis, a first side at which the first leads are located and a second side at which the second leads are located, any one or more of the first leads and second leads being subject to bending along a first line parallel to the axis or being subject to bending along a second line perpendicular to the first line or being subject to a combined bending having a component along the first line and a component along the second line, comprising:
(a) a housing having a first side and a second side spaced apart from said first side, said first side and said second side of said housing defining a channel through which the body is movable;
(b) a first circuit board and a second circuit board having optical means for generating lead-alignment data, said optical means including
(i) first means for producing a first light beam being adapted to traverse a first path along the second line and to intersect only the first leads;
(ii) first means for sensing the first light beam;
(iii) second means for producing a second light beam being adapted to traverse a second path at an angle to the first line and the second line and to intersect only the first leads; and
(iv) second means for sensing the second light beam;
(c) first means for supporting said first circuit board on said first side of said housing; and
(d) second means for supporting said second circuit board on said second side of said housing.

10. A self-contained module according to claim 9 wherein said first circuit board and said second circuit board each includes a plurality of alignment holes, and said first supporting means and said second supporting means each includes a plurality of alignment pins for receiving said alignment holes.

11. A self-contained module according to claim 9 wherein the spacing between said first circuit board supported on said first supporting means on said first side of said housing and said second circuit board supported on said second supporting means on said second side of said housing is predetermined relative to the size of the body.

12. A self-contained module for determining the alignment of any one or more of a plurality of first leads and second leads extending from a body having an axis, a first side at which the first leads are located and a second side at which the second leads are located, any one or more of the first leads and second leads being subject to bending along a first line parallel to the axis or being subject to bending along a second line perpendicular to the first line or being subject to a combined bendng having a component along the first line and a component along the second line, comprising:
(a) a housing having a first side and a second side spaced-apart from said first side, said first side and said second side of said housing defining a channel through which the body is movable;
(b) a first circuit board and a second circuit board having optical means for generating lead alignment data;
(c) first means for supporting said first circuit board on said first side of said housing;
(d) second means for supporting said second circuit board on said second side of said housing; and
(e) wherein said optical means for generating lead-alignment data includes
(i) first means, supported on said second circuit board, for producing a first light beam being adapted to traverse a first path along the second line and to intersect only the first leads;
(ii) first means, supported on said first circuit board, for sensing the first light beam;
(iii) second means, supported on said first circuit board, for producing a second light beam being adapted to traverse a second path along the second line and to intersect only the second leads;
(iv) second means, supported on said second circuit board, for sensing the second light beam;
(v) third means, supported on said second circuit board, for producing a third light beam being adapted to traverse a third path at an angle to the first line and the second line and to intersect only the first leads;
(vi) third means, supported on said first circuit board, for sensing the third light beam;
(vii) fourth means, supported on said first circuit board, for producing a fourth light beam being adapted to traverse a fourth path at an angle to the first line and the second line and to intersect only the second leads; and
(viii) fourth means, supported to said second circuit board, for sensing the fourth light beam.

13. A self-contained module according to claim 12 wherein the body has a front end, and wherein said optical means further comprises:
(a) fifth means for producing a fifth light beam being adapted to traverse a fifth light path extending across and intersecting the front end, the fifth path being anterior of the first through fourth paths;

(b) fifth means for sensing the fifth light beam;

(c) sixth means for producing a sixth light beam being adapted to traverse a sixth path extending across and intersecting the front end, the sixth path being posterior of the first through fourth paths and at a predetermined distance from the fifth path; and (d) sixth means for sensing the sixth light beam.

14. A self-contained module according to claim 12 wherein the body has a cover and a base, the first leads and the second leads being supported on the base between the cover and the base, and wherein the cover and the base are subject to relative misalignment, and wherein said optical means further comprises:

(a) fifth means for producing a fifth light beam being adapted to traverse a fifth path extending across and intersecting the cover;

(b) fifth means for sensing the fifth light beam;

(c) sixth means for producing a sixth light beam being adapted to traverse a sixth path extending across and intersecting the base; and (d) sixth means for sensing the sixth light beam.

15. Apparatus for determining the alignment of a plurality of leads on a body having an axis, the leads being spaced apart from each other and wherein the leads are subject to bending along a first line parallel to the axis or to bending along a second line perpendicular to the first line or to a combined bending having a component along the first line and a component along the second line, comprising:

(a) optical means for producing data having information of the spacing between the leads, including (i) first means for producing a first light beam being adapted to traverse a first path along the second line and to intersect each of the leads;

(ii) first means for sensing the first light beam and producing first output data having information of the spacing between the leads along the first line;

(iii) second means for producing a second light beam being adapted to traverse a second path at an angle to the first line and the second line and to intersect the leads; and (iv) second means for sensing the second light beam and producing second output data having combined information of the spacing between the leads along the first line and the second line; and (b) data processor means for determining the spacing between the leads in response to the first and second output data.

16. Apparatus according to claim 15 wherein said data processor means comprises:

(a) first means for determining the distance between the leads along the first line in response to the first output data; and (b) second means for determining the distance between the leads along the second line in response to the first output data and the second output data.

17. Apparatus according to claim 16 wherein said second means for determining comprises means for subtracting the information of the first output data from the information of the second output data.

18. Apparatus for determining the alignment of any one or more of a plurality of first leads spaced from one another and second leads spaced from one another, the first leads and the second leads extending from a body having an axis, a first end, a first side at which the first leads are located and a second side at which the second leads are located, any one or more of the first leads and the second leads being subject to parallel bending along a first line parallel to the axis or being subject to camber bending along a second line perpendicular to the first line or being subject to a combined bending having a component of parallel bending along the first line and a component of camber bending along the second line, comprising:

(a) means for moving the body;

(b) optical means for producing first data having information of the parallel bending of the first leads and the parallel bending of the second leads along the first line and for producing second data having information of the combined bending of the first leads and the combined bending of the second leads along the first line and along the second line, the body being movable relative to said optical means; and (c) data processor means for determining the parallel bending of the first leads and the parallel bending of the second leads along the first line in response to the first data and the camber bending of the first leads and the camber bending of the second leads along the second line in response to the first data and the second data.

19. Apparatus according to claim 18 wherein said means for moving comprises gravity-fed means for directing the body across said optical means.

20. Apparatus according to claim 18 wherein said optical means comprises:

(a) first light source means for producing a first light beam being adapted to traverse a first path along the second line and to intersect points on only the first leads;

(b) first means for sensing the first light beam and producing first output data having information of the spacing between the first leads along the first line;

(c) second light source means for producing a second light beam being adapted to traverse a second path along the second line and to intersect points on only the second leads;

(d) second means for sensing the second light beam and producing second output data having information of the spacing between the second leads along the first line;

(e) third light source means for producing a third light beam being adapted to traverse a third path at an angle to the first line and the second line and to intersect points on only the first leads;

(f) third means for sensing the third light beam and producing third output data having combined information of the spacing between the first leads along the first line and the second line;

(g) fourth light source means for producing a fourth light beam being adapted to traverse a fourth path at an angle to the first line and the second line and to intersect points only on the second leads;

(h) fourth means for sensing the fourth light beam and producing fourth output data having combined information of the spacing between the second leads along the first line and the second line;

(i) fifth light source means for producing a fifth light beam being adapted to traverse a fifth path extending across and intersecting the front end, the fifth path being anterior of the first through fourth paths;

(j) fifth means for sensing the fifth light beam and producing fifth output data;

(k) sixth light source means for producing a sixth light beam being adapted to traverse a sixth path extending across and intersecting the front end, the sixth path being posterior of the first through fourth paths and at a predetermined distance from the fifth path; and (l) sixth means for sensing the sixth light beam and producing sixth output data, the fifth output data and the sixth output data having information of the velocity of the body.

21. Apparatus according to claim 18 wherein the body has a shape, and said means for moving comprises rails for guiding the body, said rails having a shape contoured to the shape of the body.

22. Apparatus for determining the alignment of at least one portion extending from an object having an axis, the portion being subject to bending along a first line parallel to the axis or being subject to bending along a second line perpendicular to the first line or being subject to a combined bending having a component along the first line and a component along the second line, comprising:

(a) first means for producing a first light beam being adapted to traverse a first path along the second line and to intersect the portion;

(b) first means for sensing the first light beam, (c) second means for producing a second light beam being adapted to traverse a second path at an angle to the first line and the second line and to intersect the portion; and (d) second means for sensing the second light beam.

23. Apparatus for determining the alignment of any one or more of a plurality of first portions and second portions extending from an object having an axis, a first side at which the first portions are located and a second side at which the second portions are located, any one or more of the first portions and second portions being subject to bending along a first line parallel to the axis or being subject to bending along a second line perpendicular to the first line or being subject to a combined bending having a component along the first line and a component along the second line, comprising:

(a) first means for producing a first light beam being adapted to traverse a first path along the second line and to intersect only the first portions;

(b) first means for sensing the first light beam;

(c) second means for producing a second light beam being adapted to traverse a second path along the second line and to intersect only the second portions;

(d) second means for sensing the second light beam;

(e) third means for producing a third light beam being adapted to traverse a third path at an angle to the first line and the second line and to intersect only the first portions;

(f) third means for sensing the third light beam;

(g) fourth means for producing a fourth light beam being adapted to traverse a fourth path at an angle to the first line and the second line and to intersect only the second portions; and (h) fourth means for sensing the fourth light beam.

24. Apparatus for determining the alignment of any one or more of a plurality of first portions spaced from one another and second portions spaced from one another, the first portions and the second portions extending from an object having an axis, a first end, a first side at which the first portions are located and a second side at which the second portions are located, any one or more of the first portions and the second portions being subject to parallel bending along a first line parallel to the axis or being subject to camber bending along a second line perpendicular to the first line or being subject to a combined bending having a component of parallel bending along the first line and a component of camber bending along the second line, comprising:

(a) means for moving the object;

(b) optical means for producing first data having information of the parallel bending of the first portions and the parallel bending of the second portions along the first line and for producing second data having information of the combined bending of the first portions and the combined bending of the second portions along the first line and along the second line, the object being movable relative to said optical means; and (c) data processor means for determining the parallel bending of the first portions and the parallel bending of the second portions along the first line in response to the first data and the camber bending of the second portions along the second line in response to the first data and the second data.

* * * * *